United States Patent
Urban et al.

(10) Patent No.: US 7,642,545 B2
(45) Date of Patent: Jan. 5, 2010

(54) LAYER AND SYSTEM WITH A SILICON LAYER AND A PASSIVATION LAYER, METHOD FOR PRODUCTION OF A PASSIVATION LAYER ON A SILICON LAYER AND USE THEREOF

(75) Inventors: Andrea Urban, Stuttgart (DE); Franz Laermer, Weil der Stadt (DE); Klaus Breitschwerdt, Filderstadt (DE)

(73) Assignee: Robert Bosch GmbH, Stuttgart (DE)

( * ) Notice: Subject to any disclaimer, the term of this patent is extended or adjusted under 35 U.S.C. 154(b) by 250 days.

(21) Appl. No.: 10/520,886

(22) PCT Filed: May 6, 2003

(86) PCT No.: PCT/DE03/01436

§ 371 (c)(1),
(2), (4) Date: Jul. 21, 2005

(87) PCT Pub. No.: WO2004/016546

PCT Pub. Date: Feb. 26, 2004

(65) Prior Publication Data

US 2006/0068510 A1   Mar. 30, 2006

(30) Foreign Application Priority Data

Jul. 30, 2002   (DE)   ................................ 102 34 589

(51) Int. Cl.
*H01L 21/00* (2006.01)
(52) U.S. Cl. ................. 257/40; 257/72; 257/79
(58) Field of Classification Search ............... 257/40, 257/72, 79
See application file for complete search history.

(56) References Cited

U.S. PATENT DOCUMENTS 4,576,834 A   3/1986   Sobczak (Continued)

FOREIGN PATENT DOCUMENTS

DE   42 41 045   6/1994

(Continued)

OTHER PUBLICATIONS

Ohara, J; Kano, K.; Takeuchi, Y.; Ohya, N.; Otsuka, Y.; Akita, S.: "A new deep reactive ion etching process by dual sidewall protection," Proceeding IEEE Thirteenth Annual International Conference On Micro Electro Mechanical Systems, Miyazaki, Japan, Jan. 23-27, 2000, pp. 277-282.

*Primary Examiner*—Laura M Menz
(74) *Attorney, Agent, or Firm*—Kenyon & Kenyon LLP

(57) ABSTRACT

A layer system and a method for producing the layer system are provided, the layer system having a silicon layer, on which at least regionally a passivating layer is superficially deposited, the passivating layer having a first, at least largely inorganic partial layer and a second, at least largely polymer partial layer. The method includes producing on the silicon layer, a first, inorganic partial layer, and producing on this first partial layer a second, polymer partial layer, which form the passivating layer. The production of the intermediate layer occurs in such a way that the intermediate layer in its surface area adjoining the first partial layer is composed as the first partial layer, and the intermediate layer in its surface area adjoining the second partial layer is composed as the second partial layer. The composition of the intermediate layer transitions, either continuously or in steps, from the composition corresponding to the first partial layer into the composition corresponding to the second partial layer.

4 Claims, 1 Drawing Sheet

U.S. PATENT DOCUMENTS

| | | |
|---|---|---|
| 5,116,460 A | 5/1992 | Bukhman |
| 6,284,657 B1 * | 9/2001 | Chooi et al. ................. 438/687 |
| 6,644,767 B2 * | 11/2003 | Silverbrook ................. 347/11 |
| 2001/0049195 A1 * | 12/2001 | Chooi et al. ................. 438/687 |
| 2001/0055878 A1 * | 12/2001 | Chooi et al. ................. 438/687 |
| 2002/0001951 A1 * | 1/2002 | Chooi et al. ................. 438/687 |
| 2002/0001952 A1 * | 1/2002 | Chooi et al. ................. 438/687 |
| 2004/0121486 A1 * | 6/2004 | Uhland et al. ............... 436/174 |
| 2006/0068510 A1 * | 3/2006 | Urban et al. .................... 438/6 |
| 2006/0100608 A1 * | 5/2006 | Uhland et al. ............ 604/891.1 |
| 2006/0108576 A1 * | 5/2006 | Laermer et al. ............... 257/40 |
| 2007/0114524 A1 * | 5/2007 | Oh et al. ....................... 257/40 |
| 2007/0128758 A1 * | 6/2007 | Tanaka et al. ................. 438/50 |
| 2007/0268327 A9 * | 11/2007 | Silverbrook ................. 347/20 |
| 2008/0311751 A1 * | 12/2008 | Laermer et al. ............. 438/694 |

FOREIGN PATENT DOCUMENTS

| | | |
|---|---|---|
| DE | 44 20 962 | 12/1995 |
| DE | 197 06 682 | 8/1998 |
| DE | 199 00 179 | 2/2000 |
| DE | 198 47 455 | 4/2000 |
| DE | 199 19 469 | 11/2000 |
| JP | 5-136105 | 6/1993 |
| WO | WO 00/67307 | 11/2000 |

\* cited by examiner

LAYER AND SYSTEM WITH A SILICON LAYER AND A PASSIVATION LAYER, METHOD FOR PRODUCTION OF A PASSIVATION LAYER ON A SILICON LAYER AND USE THEREOF

FIELD OF THE INVENTION

The present invention relates to a layer system including a silicon layer and a passivating layer, a method for producing a passivating layer on a silicon layer and the use of this layer system.

BACKGROUND INFORMATION

According to a method described, e.g., in published German patent document DE 44 20 962, self-supporting MEMS structures in silicon (MEMS="microelectromechanical structures") are produced by a combination of anisotropic and isotropic etching techniques, and so-called trenches or deep structures having vertical side walls are initially anisotropically etched into a silicon substrate using a reactive plasma. Once the desired etching depth is achieved, then, following a longer passivating step for depositing a Teflon-like film, a longer etching step is performed, during which first a Teflon polymer that formed on the etching ground of the trench is removed by ionic bombardment and subsequently the self-supporting MEMS structures to be produced are isotropically undercut. During this isotropic undercutting, the vertical side walls of the trenches are protected from an etch attack by the previously applied Teflon-like film. According to published German patent document DE 44 20 962, the isotropic undercutting of the MEMS structures produced proceeds in the silicon substrate material on a purely time-controlled basis.

For depositing the Teflon-like film, a fluorohydrocarbon having a fluorine to carbon ratio that is as low as possible, e.g., 2:1, may be used, fluorohydrocarbons such as $C_4F_6$, $C_5F_8$, $C_4F_8$ or $C_3F_6$ being suitable for this purpose. A process gas that generally etches isotropically and that provides fluorine radicals, such as SF6, may be used for etching silicon.

Published German patent document DE 198 47 455 describes limiting isotropic undercutting vertically with the aid of buried oxide layers. Particularly, an etch attack on the MEMS structures is prevented by an intermediate oxide separating the MEMS structure from a sacrificial layer made of silicon. Moreover, it is also described that, instead of using fluorine radicals from a plasma discharge, isotropic undercutting can also be performed using spontaneously and plasmalessly silicon-etching fluorine compounds such as $XeF_2$, $ClF_3$ or $BrF_3$. Following adsorption and chemisorption on a silicon surface, these compounds spontaneously split off fluorine radicals, which results in an isotropic etching removal of the silicon through the formation of silicon tetrafluoride. At the same time there is a very high selectivity vis-à-vis non-silicon materials such as Teflon-like passivating layers or passivating layers of other compositions. In particular, photo-resist is attacked by $ClF_3$ in a way that is practically not measurable, so that on the one hand it is particularly easy to passivate parts of a silicon wafer that are not to be etched, while on the other hand very thin passivating layers are already sufficient to ensure complete protection against an etch attack. In many cases, the so-called "native" silicon oxide normally present anyway on silicon surfaces is already able to withstand a chlorine trifluoride attack for several minutes without the silicon underneath it being etched.

A further aspect in the use of $ClF_3$ (and in a limited way also $BrF_3$) is the generally low reactivity of these highly oxidizing fluorine compounds vis-à-vis silicon, which has the result that an etching performed with them proceeds in a reaction-controlled manner over a wider parameter range and is not limited by a mass transport. This being the case, large undercutting widths can be achieved without a reduction of the etch rate due to a growing aspect ratio of the undercutting channels. With the aid of these gases it is possible, for example, for the lateral extension of the undercutting channels to amount to a multiple, e.g., 100 to 1000, of their vertical extension.

Finally, isotropic etching using these gases occurs entirely without ion action, which is of great advantage with regard to the desired isotropy and selectivity vis-à-vis non-silicon materials.

On the whole, $ClF_3$ is in many respects an ideal gas for the selective removal of silicon or porous silicon within the scope of a sacrificial layer technique in that it allows in a very simple manner for the creation of self-supporting membrane structures with minimal restrictions on the freedom of design. In many cases, even a single etch opening is sufficient in order to achieve a complete undercutting of a membrane area on porous silicon for example.

On the other hand, the disadvantage in the use of $ClF_3$, and with qualifications also of $BrF_3$, is the fact that it very easily spreads unchecked via microchannel structures or even nanochannel structures, so that there is a great danger of it creeping extremely quickly behind deposited passivating layers, for example Teflon-like side wall passivating layers described in published German patent document DE 42 41 045, via micro- or nanocracks in the interface area to the silicon.

Thus, a Teflon-like plasma passivating layer produced from $C_4F_8$ or $C_3F_6$ has sufficiently many microchannels or nanochannels in the interface area to the silicon below so as to expose, starting from a single opening, for example on the etching ground of the initially produced trench, the entire MEMS structure over a large area to a $ClF_3$ etch attack in spite of the deposited Teflon-like passivation. A typical defect pattern in this regard is that structures, in which the etching ground was previously cleared of a passivating teflon polymer with the help of ions as described in published German patent document DE 42 41 045, are massively attacked by etching on the entire, generally passivated side wall surface, while structures, in which the etching ground had a remaining, few nanometers thick coating of a Teflon-like polymer, nowhere show signs of an etch attack, even after a long period. The cause of this problem are the microchannels or nanochannels, explained above, in the interface area between the Teflon passivation, which generally adheres poorly to silicon, and the silicon surface, which allow etching gas $ClF_3$ access to the silicon at undesired places.

An object of the present invention is to provide a passivating layer on a silicon layer, as well as a method for producing such a passivating layer on a silicon layer, which achieves a reinforced passivation of the interface between the passivating layer and the silicon layer by preventing the formation of, or alternatively by closing, undesired microscale or nanoscale channels, through which otherwise an uncontrolled etch attack, particularly by an isotropically etching gas such as $ClF_3$ or $BrF_3$, would occur. In addition, it should be possible to integrate the method and the obtained layer system with the passivating layer into plasma etching methods using photo-resist masking for producing trenches and self-supporting structures.

SUMMARY

The layer system according to the present invention and the method according to the present invention have the advantage over the related art that a very good protection of a silicon layer is thereby achieved, particularly against an etch attack by $CIF_3$ or $BrF_3$, and that almost no microscale or nanoscale channels are present in the passivating layer, through which one of these gases could attack the protected silicon layer. This being the case, the layer system according to the present invention and the method according to the present invention are particularly suitable for use in the production of at least largely or regionally self-supporting structures in silicon, which temporarily use an anisotropic etching technique, and temporarily use an isotropic undercutting technique.

It is further advantageous that the method according to the present invention and the layer system according to the present invention may be integrated into etching processes that use a photo-resist mask for producing trenches, so that one does not have to fall back on more expensive and more complex hard material masking which is generally not required in these processes.

Thus it is particularly advantageous that the problem of a highly oxidizing fluorine compound creeping behind the interface area between the passivating layer and the silicon layer can be prevented especially effectively in that the interface area is first sealed by a thin oxidic passivation which with increasing thickness of the layer is converted into a Teflon-like surface layer with the help of process technology.

Here it must be ensured that such a passivating layer in the sense of a complete sealing layer made of an oxide layer and a Teflon-like layer deposited on top of it on the one hand renders inert all reactive bonding areas of the surface of the silicon layer and makes them unsusceptible to the attack of the highly oxidizing fluorine compounds, and, on the other hand, that it is thick enough to withstand even an etching process of longer duration.

In general, an oxide layer merely 1 nm to 2 nm thin, stemming for example from a plasma oxidation of the surface of the silicon layer, already constitutes a suitable passivation at the atomic level, which would not be susceptible to highly oxidizing fluorine compounds creeping behind it, but which, due to its limited thickness, only briefly withstands an etch attack. In this respect, the attempt to reinforce such an oxide passivation of a silicon surface, which is only a few nanometers thick, directly by a Teflon-like polymer, deposited for example by a plasma, already leads, especially in combination with a usually unavoidable entry of ions on structure side walls for example, to a damaging of the oxide passivation.

One of many possible undesired etching reactions in connection with the process gas $C_4F_8$ for the production of Teflon-forming monomers proceeds according to:

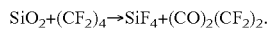
$SiO_2+(CF_2)_4 \rightarrow SiF_4+(CO)_2(CF_2)_2$.

Thus, it is often not readily possible to deposit a polymer Teflon-like layer immediately onto an atomic silicon oxide passivation in an at least nearly conformal manner without thereby having to accept damage to, or a removal of, the oxide passivation.

Against this background, it is particularly advantageous if, for the sealing or passivation of the silicon layer to be protected, a sequence of layers is used, initially an oxide layer of a thickness of 1 nm to 100 nm, particularly 5 nm to 30 nm, being deposited immediately on the silicon layer or on a silicon oxide surface that is already native or is obtained by plasma oxidation, and, following the production of this layer or the achievement of this thickness of the layer, with the continued growth in the thickness of the passivating layer, a layer being produced by a selective variation of the process parameters, which successively passes over into a Teflon-like layer.

This Teflon-like layer can then be reinforced via a conventional deposition process known, e.g., from published German patent document DE 42 41 045, to a layer thickness of for example 30 nm to 800 µm, particularly 50 nm to 400 nm.

Overall, one has thereby advantageously produced over of a primary thin passivation made from an oxide layer a secondary thick passivation made from a polymer layer, e.g., a Teflon-like layer, which can withstand even etching processes of long duration and which has favorable chemical surface properties even vis-à-vis a use of highly oxidizing fluorine compounds such as $CIF_3$.

It is further especially advantageous if, as explained, the initially grown first partial layer, especially in the form of an oxide layer, is with progressive layer growth continuously or in discrete steps converted more and more into a polymer partial layer, particularly the Teflon-like layer.

Furthermore, it is advantageous that, although silicon oxide layers are usually deposited from a silane such as $SiH_4$ or TEOS (tetraethyl orthosilicate) or other organic silicon compounds which are incompatible with the chemistry of the Teflon-forming, i.e., for example perfluorinated monomers, a plasma etching method for silicon is already described, e.g., in published German patent document DE 197 06 682, in which an oxide passivation compatible with a fluorine etching chemistry is performed. This process is based on a combination of silicon tetrafluoride and oxygen or $N_2O$, with the aid of which an oxide film can be built up on a silicon surface, for example on the side walls of trenches.

In addition, a process of this type is not only compatible with a fluorine etching chemistry, in accordance with published German patent document DE 42 41 045, for example, i.e., with free fluorine radicals or fluorine radicals released in a plasma, but also vis-à-vis Teflon-forming monomers. Although the Teflon-forming monomers, as already explained at the beginning, can result in a degradation of an already produced silicon oxide, which is also utilized as described in published German patent document DE 197 06 682 by a continually or intermittently added scavenger gas, it is nevertheless possible to control the relative intensities of the individual reactions of "deposition" or "etching" occurring in the process through a suitable composition of the process gas with a Teflon-former, silicon tetrafluoride and an oxygen carrier. In addition, a thin silicon oxide layer deposited with the aid of $SiF_4$ and oxygen or $N_2O$ as described in published German patent document DE 197 06 682 is also compatible with a photo-resist masking of a silicon wafer.

Hence it is also especially advantageous if a passivation of a silicon structure or a silicon layer initially begins with an action of a plasma of silicon tetrafluoride and an oxygen carrier on the silicon substrate, the substrate having furthermore been preferably pretreated prior to an $O_2$ cleaning step in a plasma stripper for the removal of organic residues, for example on side walls, and a subsequent plasma oxidation, for example of side wall surfaces. Following this optional pretreatment, through a reaction of the silicon tetrafluoride with the oxygen carrier, a silicon oxide layer, for example of a thickness of 10 nm to 20 nm, is then grown, as the first partial layer of the passivating layer, on the silicon layer over the surface oxide possibly already natively present or obtained by plasma oxidation. Subsequently, a Teflon-forming monomer-providing gas such as $C_4F_8$ or $C_3F_6$, preferably having initially a low gas flow, is added to the plasma.

In this manner, first the deposition of the silicon oxide layer on the silicon layer, for example on the side walls of trenches, is slowed down, and afterwards carbon and fluorine are increasingly inserted into the subsequently deposited layer.

A further increase, continuous or in discrete steps, of the flow of the Teflon-forming, monomer-providing process gas and a corresponding reduction of the flow of the oxygen carrier or oxygen together with the silicon carrier silicon tetrafluoride then causes the deposited or growing layer to become, continuously or in discrete steps, increasingly Teflon-like, i.e., it has a gradually decreasing proportion of silicon, SiO or $SiO_2$, which is additionally cross-linked in multiple ways with the produced Teflon filament structures and thereby partly also forms carbidic bonds, i.e., bonds between silicon and carbon.

If finally only a Teflon-forming, monomer-providing process gas such as $C_4F_8$ or $C_3F_6$ is allowed to enter into the plasma, a pure Teflon film or a Teflon-like film of the structure $(-CF_2-)_n$ is eventually grown on the transitional layer produced as explained. Thus an abrupt transition is avoided between the first, inorganic partial layer of the passivating layer, which here takes the form of a silicon oxide layer, and the second, polymer partial layer of the passivating layer, which preferably takes the form of a Teflon-like layer or Teflon layer. On the contrary, in this manner, a continuous or graduated transition of the composition of the intermediate layer between the first partial layer and the second partial layer is produced, which is advantageous especially under the aspect of an improved adhesion of the Teflon-like partial layer on the silicon oxide-like partial layer.

Finally, an advantage of the method according to the present invention is the fact that a variation of the process gases used provides a multitude of different strategies for adapting the properties of the deposited layers to the requirements of the individual case. Thus, for example, it is possible to increase at first only the flow of the Teflon-forming process gas slowly to its final value, while initially still keeping the flows of silicon tetrafluoride and of the oxygen carrier, for example oxygen or $N_2O$, constant, and only subsequently to reduce, individually or in combination, the gas flows of silicon tetrafluoride and oxygen or oxygen carrier, synchronously or in succession, in steps or continuously to zero.

In addition to a particularly good adhesion or chemical bond of the passivating layer on/with the silicon layer, the advantages of a graduated transition or the provision of a graduated layer as an intermediate layer between the first, inorganic partial layer and the second, polymer partial layer also lie in the area of a particularly effective sealing of the silicon layer that is thereby achieved.

DETAILED DESCRIPTION

Figure 1:
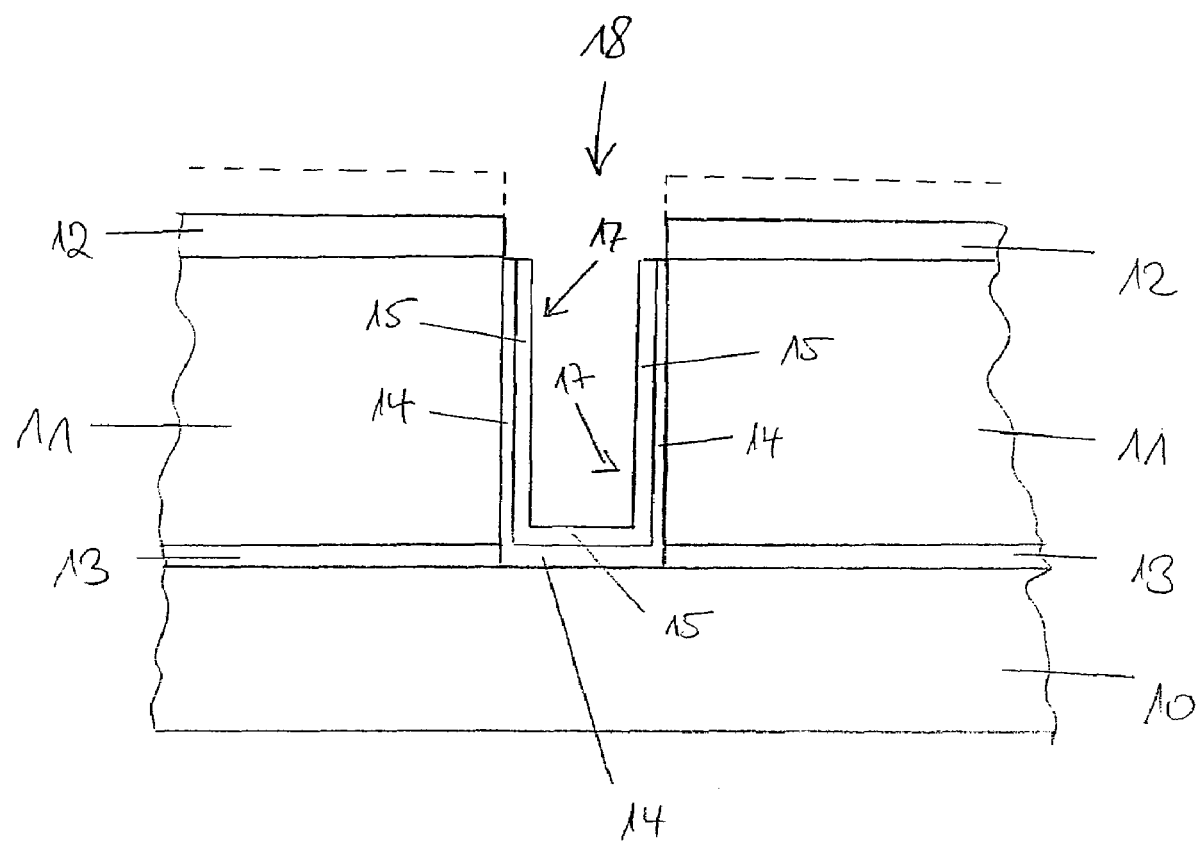
FIG. 1 shows a cross-sectional view through a layer system that is structured in the form of a trench.

An exemplary embodiment of a layer system having a silicon layer and a regionally, superficially deposited passivating layer, as well as the method for producing such a passivating layer on a silicon layer, are explained with reference to FIG. 1. In particular, one initially starts from a silicon wafer, which supports a layer system, having buried oxide layers, polysilicon layers and a functional silicon layer, on which a photo-resist masking is deposited, which defines the structures to be produced in the silicon layer.

For this purpose, FIG. 1 shows a first silicon layer 10, made of polysilicon, for example, on a substrate (not shown) and possibly existing buried oxide layers, on which layer 10 there is a separating layer 13, made of silicon oxide, for example. On separating layer 13, a second silicon layer 11 is deposited as a functional silicon layer, on top of which there is a resist mask 12. FIG. 1 furthermore shows that with the aid of photo-resist mask 12 regionally a trench 18 was etched into second silicon layer 11, which extends all the way to first silicon layer 10, i.e. it also traverses separating layer 13.

Concretely, following photoprocessing for producing resist mask 12, e.g., using the process described in published German patent document DE 42 41 045, trench 18 is etched into second silicon layer 11, which is for example made up of 11 μm thick epipolysilicon. This process stops automatically on separating layer 13 made of an isolation oxide, which separates functional second silicon layer 11 from first silicon layer 10. In the area of trench 18, the thickness of first separation layer 13 is 50 nm for example. Second silicon layer 11 is used for example for producing self-supporting structures within it.

Using a subsequent oxide etching step, separating layer 13 is then initially etched through selectively with respect to silicon and selectively with respect to the photo-resist masking from the trench process described, e.g., in published German patent document DE 42 41 045, with the aid of a plasma.

For this purpose, $CHF_3$, $C_2F_6$, $C_3F_6$, $C_4F_8$ or a mixture of one of these gases with $CF_4$ for example are used as a suitable, selectively acting process gas. For the oxide etching step, $C_4F_8$ or a mixture of $C_4F_8$ and $CF_4$ are preferably used. Here, the addition of $CF_4$ mainly serves to control a polymer formation in the plasma during the etching of separating layer 13, i.e., of $SiO_2$, although it must be noted that an addition of $CF_4$ results in a deterioration of the selectivity of the etching of $SiO_2$ with respect to silicon or photo-resist.

After separating layer 13 has been etched through and following a relative stop of the etching process on first silicon layer 10, first undefined Teflon-like layers on the side walls or on the bottom of trench 18, as may still be present from the process described in published German patent document DE 42 41 045, for example, which was carried out beforehand, are removed with the aid of an oxygen plasma. Afterwards the exposed silicon surfaces are provided in a controlled manner with an oxide that is as dense as possible, preferably silicon oxide. Here, the initial oxide is preferably already produced by surface oxidation during the prior $O_2$ plasma discharge for removing polymer residues.

To this end, following the plasma etching step for etching separation layer 13, the wafer having the layer structure in accordance with FIG. 1 is first subjected to a plasma oxidation, preferably in an $O_2$ plasma stripper. In the acidic plasma in the plasma stripper, on the one hand undefined Teflon-like residues are removed, while on the other hand accessible silicon surfaces are oxidized, resulting in the formation of a dense surface oxide.

This "grown" surface oxide on first silicon layer 10 or on second silicon layer 11 is then first of all reinforced using a silicon oxide preferably deposited on it immediately afterwards using the process described in, e.g., published German patent document DE 197 06 682, i.e., with the aid of $SiF_4$ and an oxygen carrier. In this manner, a first, inorganic partial layer, which in the example explained is made at least approximately of silicon dioxide ($SiO_2$), is formed on the side walls of second silicon layer 11 or on the accessible surface of first silicon layer 10 according to FIG. 1 on the surface oxide (SiO$_2$) previously produced thereon, which is not shown in FIG. 1.

Incidentally, it should be mentioned that, during the removal of the Teflon-like residues of the preprocess and of the surface oxidation in the oxygen plasma stripper, resist mask 12 is inevitably partly removed along with it, reducing its thickness. This is indicated in FIG. 1 by a dashed line representing the greater thickness of resist mask 12 prior to the state according to FIG. 1.

In particular, the process must be conducted in such a way that for the subsequent process now carried out there still remains a sufficiently thick resist mask 12, i.e., for example a resist mask 12 having a thickness of 200 nm to 500 nm starting from a resist layer having an original thickness of 1000 nm to 2000 nm.

Afterwards, the wafer is put into a plasma reactor, e.g., having a high-density, inductively coupled plasma source as described in, e.g., published German patent document DE 199 00 179, as is frequently used for carrying out the process as described in published German patent document DE 42 41 045.

Subsequently, a second, polymer partial layer 15 is deposited on first, inorganic partial layer 14.

For this purpose, one begins for example with a gas flow of the process gas SiF$_4$ of 50 sccm (sccm=cm$^3$/min at normal pressure) to 200 sccm, for example 100 sccm, together with a gas flow of oxygen or an oxygen carrier such as N$_2$O, SO$_2$, NO$_2$, NO, CO$_2$, H$_2$O of 10 sccm to 200 sccm, for example 50 sccm, at a pressure of for example 10 µbar to 100 µbar, for example 10 µbar to 50 µbar, in the etching apparatus and a plasma power of 500 Watts to 1000 Watts at the inductive source. Furthermore, the substrate electrode is optionally polarized with a high-frequency power of 5 Watts to 50 Watts, e.g., 5 Watts, in order to compact the initially deposited inorganic partial layer 14 and to drive fluorine out of it.

Following a deposition of for example 10 nm silicon oxide, which occurs within 30 s to 1 min, for example C$_4$F$_8$ or C$_3$F$_6$ is then added as a process gas forming Teflon and providing monomers in the plasma, the gas flow being slowly increased, for example within 30 s to 5 min, preferably within one minute, continuously or in discrete steps, starting from zero up to a final gas flow. The final gas flow may lie in the range of 10 sccm to 500 sccm, for example at 50 sccm to 250 sccm. During the time span within which the feeding rate of the Teflon-former is increased, the gas flows of the initially used SiF$_4$ and of the oxygen carrier may either be synchronously reduced to zero, or these gas flows are initially left constant and are individually or collectively reduced to zero once the set final gas flow of the Teflon-former has been reached. For this so-called "downramping", time spans of 30 s to 5 min, e.g., one minute, are suitable as well.

It is possible, of course, to mix the above-mentioned procedures, i.e., to combine the run up or ramp down of individual gases in the etching chamber or to perform these independently of one another, which in each case will result in a different composition of the layer produced on inorganic partial layer 14.

A synchronous run up of the gas flow of the Teflon-forming gas and ramp down of the gas flow of the silicon carrier and oxygen carrier may be desired, the sum of the gas flows of all process gases remaining constant at every moment.

For example, one starts with a flow of 50 sccm of the oxygen carrier and 50 sccm of the silicon carrier as well as 0 sccm of the Teflon-former, the gas flow of the Teflon-carrier gradually being run up and the gas flow of the silicon carrier and of the oxygen carrier being gradually ramped down, so that the sum of the gas flow of all process gases is always 100 sccm, until finally only a gas flow of the Teflon-former of 100 sccm remains and all other gases are ramped down to a gas flow of 0 sccm. With this procedure, it is also possible to maintain an approximately constant process pressure in the etching chamber without additional measures.

Following the conclusion of this "ramping procedure", the deposition with the aid of the Teflon former, i.e., the production of a Teflon layer or a Teflon-like layer, is continued for a few minutes, for example one minute to five minutes, preferably two minutes, only a Teflon-like film now still being deposited as a secondary passivation on top of the previously produced layer system.

Afterwards, the passivation of silicon layer 11 by well-adhering passivating layer 14, 15 is completed, sealing the interface area between silicon layer 11 and passivating layer 14, 15 sufficiently well so as to prevent subsequently used highly oxidizing fluorine compounds such as ClF3 from accessing passivated silicon layer 11 and thus to prevent an undesired undercutting of passivating layer 14, 15.

All in all, an optionally thin silicon oxide layer not shown in FIG. 1, on which first, inorganic partial layer 14 is located, is initially deposited, by the method explained above, on first silicon layer 10, which is accessible in the area of the bottom of trench 18, as well as on second silicon layer 11, which is accessible in the area of the side walls of trench 18. This partial layer 14 may be a silicon oxide layer. On first, inorganic partial layer 14 there is then further an intermediate layer, likewise not shown in FIG. 1, which in its surface area adjacent to first partial layer 14 is at least approximately composed as the latter, which in its surface area adjacent to second partial layer 15 according to FIG. 1 is at least approximately composed as second partial layer 15, and which in its composition passes over, continuously or in steps, from the composition corresponding to first partial layer 14 into the composition corresponding to second partial layer 15. To this extent, this intermediate layer may also be referred to as a gradient layer. On the intermediate layer there is finally second, polymer partial layer 15 according to FIG. 1, which may be a Teflon layer or a Teflon-like layer, as is produced by a method according to published German patent document DE 42 41 045, for example.

In the layer structure explained above, as indicated, it is also possible to dispense with the silicon oxide layer located between first inorganic partial layer 14 and silicon layers 11 or 10, or this is, if inorganic partial layer 14 is implemented as a silicon oxide layer, indistinguishable or hardly distinguishable from the latter.

Finally, for producing a self-supporting MEMS structure, beginning from the stage according to FIG. 1, passivating layer 17 present at the bottom of trench 18 is first selectively penetrated by a comparatively short etching step using SF$_6$ or CF$_4$, C$_2$F$_6$, CHF$_3$, C$_4$F$_8$ or a mixture of these gases with SF$_6$ as an etching gas with ion support in a plasma at the bottom of trench 18, and subsequently an MEMS structure to be exposed is isotropically undercut using ClF$_3$ or BrF$_3$, i.e., a highly oxidizing fluorine chemistry. The undercutting may be time-controlled, or it may be design-controlled by a lateral boundary of buried polysilicon islands that are to be removed. Following the completion of the undercutting process, the wafer is taken out of the etching chamber, and remaining resist mask 12 and remaining Teflon-like parts of passivating layer 17 are removed by another O$_2$ plasma stripping.

Furthermore, thin silicon oxide layers may finally be removed by a brief overetching using HF vapor in all those places where this is desired for reasons of reduced mechanical stress gradients, for example on the underside of an exposed MEMS structure.

What is claimed is:

1. A layer system, comprising:
   a silicon layer; and
   a passivating layer at least regionally and superficially deposited on the silicon layer, wherein the passivating layer has a substantially inorganic first partial layer and a substantially polymer second partial layer;
   wherein, within the passivating layer, at least regionally an intermediate layer situated between the first partial layer and the second partial layer and adjoining both the first and second partial layers is provided, wherein the intermediate layer has a composition such that in a surface area of the intermediate layer adjoining the first partial layer, the intermediate layer has a composition at least approximately similar to the first partial layer, and in a surface area of the intermediate layer adjoining the second partial layer, the intermediate layer has a composition at least approximately similar to the second partial layer, and wherein the intermediate layer transitions, one of continuously and in steps, from the composition at least approximately similar to the first partial layer to the composition at least approximately similar to the second partial layer.

2. The layer system as recited in claim 1, wherein the intermediate layer contains silicon, oxygen, carbon and fluorine.

3. A layer system, comprising:
   a silicon layer; and
   a passivating layer at least regionally and superficially deposited on the silicon layer, wherein the passivating layer has a substantially inorganic first partial layer and a substantially polymer second partial layer,
   wherein, within the passivating layer, at least regionally an intermediate layer situated between the first partial layer and the second partial layer and adjoining both the first and second partial layers is provided, wherein the intermediate layer has a composition such that in a surface area of the intermediate layer adjoining the first partial layer, the intermediate layer has a composition at least approximately similar to the first partial layer, and in a surface area of the intermediate layer adjoining the second partial layer, the intermediate layer has a composition at least approximately similar to the second partial layer, and wherein the intermediate layer transitions, one of continuously and in steps, from the composition at least approximately similar to the first partial layer to the composition at least approximately similar to the second partial layer.

4. The layer system as recited in claim 3, wherein the intermediate layer contains silicon, oxygen, carbon and fluorine.

* * * * *

UNITED STATES PATENT AND TRADEMARK OFFICE
CERTIFICATE OF CORRECTION

PATENT NO. : 7,642,545 B2  Page 1 of 1
APPLICATION NO. : 10/520886
DATED : January 5, 2010
INVENTOR(S) : Urban et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 632 days.

Signed and Sealed this

Sixteenth Day of November, 2010

David J. Kappos
*Director of the United States Patent and Trademark Office*